(12) United States Patent
Hattori et al.

(10) Patent No.: US 11,332,849 B2
(45) Date of Patent: May 17, 2022

(54) METHOD OF PRODUCING PERIODIC POLARIZATION INVERSION STRUCTURES

(71) Applicant: NGK INSULATORS, LTD., Nagoya (JP)

(72) Inventors: Ryosuke Hattori, Ichinomiya (JP); Shoichiro Yamaguchi, Ichinomiya (JP); Hidetsugu Shimokata, Kasugai (JP)

(73) Assignee: NGK INSULATORS, LTD.

( * ) Notice: Subject to any disclaimer, the term of this patent is extended or adjusted under 35 U.S.C. 154(b) by 400 days.

(21) Appl. No.: 16/366,292

(22) Filed: Mar. 27, 2019

(65) Prior Publication Data

US 2019/0284720 A1 Sep. 19, 2019

Related U.S. Application Data

(63) Continuation of application No. PCT/JP2018/032190, filed on Aug. 30, 2018.

(30) Foreign Application Priority Data

Oct. 10, 2017 (JP) .............................. JP2017-196739

(51) Int. Cl.
*C30B 30/04* (2006.01)
*C30B 33/04* (2006.01)
(Continued)

(52) U.S. Cl.
CPC .............. *C30B 33/04* (2013.01); *C30B 29/30* (2013.01); *G02F 1/3551* (2013.01); *G02F 1/37* (2013.01)

(58) Field of Classification Search
CPC .......... C30B 29/04; C30B 30/02; C30B 33/04; G02F 1/3551; G02F 1/37
See application file for complete search history.

(56) References Cited

U.S. PATENT DOCUMENTS 6,522,794 B1 * 2/2003 Bischel ................... G02F 1/011
385/4
7,440,161 B2 10/2008 Morikawa et al.
(Continued)

FOREIGN PATENT DOCUMENTS

JP 2001066652 A 3/2001
JP 2002-277915 A 9/2002
(Continued)

OTHER PUBLICATIONS

Office Action of German Patent Office issued in German Application No. 11 2018 000 112.1 with English translation, dated Jul. 19, 2019 (13 pages).
(Continued)

*Primary Examiner* — Robert M Kunemund
(74) *Attorney, Agent, or Firm* — Flynn Thiel, P.C.

(57) ABSTRACT

A method of producing periodic polarization inversion structures requires the provision of first electrode piece part-arrays, each having electrode piece parts on a first main face of a ferroelectric crystal substrate. A voltage is applied on the first electrode piece part-arrays to form first periodic polarization inversion structures. Second electrode piece part-arrays are provided, each having electrode piece parts between the adjacent plural first periodic polarization inversion structures. A voltage is applied on the second electrode piece part-arrays to form second polarization inversion structures.

2 Claims, 17 Drawing Sheets

(51) Int. Cl.
    *C30B 29/30*     (2006.01)
    *G02F 1/355*     (2006.01)
    *G02F 1/37*     (2006.01)

(56) References Cited

U.S. PATENT DOCUMENTS

| | | | |
|---|---|---|---|
| 7,453,625 B2 | 11/2008 | Yamaguchi et al. | |
| 2004/0096160 A1 | 5/2004 | Hinkov et al. | |
| 2012/0063477 A1* | 3/2012 | Suyama | H01S 3/109 |
| | | | 372/32 |
| 2013/0094214 A1* | 4/2013 | Furuya | G02F 1/3558 |
| | | | 362/259 |

FOREIGN PATENT DOCUMENTS

| | | |
|---|---|---|
| JP | 2005-70192 A | 3/2005 |
| JP | 2008-304600 A | 12/2008 |
| JP | 4642065 B2 | 7/2009 |
| JP | 2014-153555 A | 8/2014 |
| WO | 2005/091066 A1 | 9/2005 |

OTHER PUBLICATIONS

Japanese language International Search Report dated Oct. 9, 2018 issued in PCT/JP2018/032190 (3 pages).
Japanese language Written Opinion dated Oct. 9, 2018 issued in PCT/JP2018/032190 (5 pages).

* cited by examiner

METHOD OF PRODUCING PERIODIC POLARIZATION INVERSION STRUCTURES

CROSS-REFERENCE TO RELATED APPLICATIONS

This is a continuation of PCT/JP2018/032190, filed Aug. 30, 2018, which claims priority to Japanese Application No. 2017-196739, filed Oct. 10, 2017, the entire contents of which are hereby incorporated by reference.

TECHNICAL FIELD

The present invention is related to the production of a periodic polarization inversion structure by a voltage application method.

A so-called voltage application method as a technique for forming a periodic polarization inversion structure in a ferroelectric non-linear optical material is known. According to the method, a comb-like electrode is formed on a main face and a uniform electrode is formed on another main face of a ferroelectric crystal substrate, and a pulsed voltage is applied between them.

It is necessary to form a deep periodic polarization inversion structure in a ferroelectric crystal to obtain a high conversion efficiency in a second-harmonic wave generation device. Patent document 1 describes that a lithium niobate substrate with the comb electrode and uniform electrode formed thereon is laminated on and integrated with a separate lithium niobate substrate and is then immersed in an insulating oil in which a voltage is applied onto the electrodes.

Further, according to the method described in patent documents 2 and 3, an insulating film is provided on a surface of a Z-cut substrate of lithium niobate, stripe-shaped elongate spaces are formed in the insulating film, and a conductive film is provided to cover the insulating film and spaces. A pulsed voltage is then applied on the conductive film to form periodic polarization inversion structures in the substrate.

RELATED DOCUMENTS

Patent Documents (Patent document 1) Japanese Patent publication No. 2005-070192A
(Patent document 2) Japanese Patent publication No. 2014-153555A
(Patent document 3) Japanese Patent No. 4642065B

SUMMARY OF THE INVENTION

Objects to be Solved by the Invention

It is necessary to increase the number of devices taken from a single wafer to realize the mass-production of the devices, each having a periodic polarization inversion structure, for example, high harmonic wave generation devices. As the method of increasing the number of the devices, two methods in which the length of the device is made smaller and an interval of positions of the devices is made smaller is known. In the case that the length of the device is made smaller according to the former method, the conversion efficiency is considerably lowered so that a desired optical output performance cannot be obtained. The length cannot thus be easily changed. On the other hand, in the case of the latter method of the interval of the devices being made smaller, the conditions of the step of forming a periodic polarization inversion structure are changed, so that it is necessary to confirm whether a stable production is possible. However, different from the former method, mass-production can be improved without sacrificing optical output performance. It was thus studied how much the distances between the adjacent periodic polarization inversion structures can be reduced. However, it was found that there was a limit on the improvement of the density of the periodic polarization inversion structures according to the following reason.

The problems will be described below referring to the Drawings.

For example, as shown in FIG. 1(a), a plurality of arrays 2 of electrode piece-parts are provided on a first main face 1a of a ferroelectric crystal substrate 1 at a predetermined interval L. An opposing electrode 22 may be formed on a second main face 1b. As shown in FIG. 1(b) (corresponding to a region A shown in FIG. 1(a)), each of the electrode piece part-arrays 2 is composed of many electrode pieces 3 and spaces 4. Then, spaces 8 are also provided between the adjacent electrode piece part-arrays 2. L represents a period of the arrays of the electrode piece parts, 30 represents a floating electrode, and 31 represents a supply electrode.

Here, as a voltage is applied between each of the electrode piece parts 3 and opposing electrode 22 as an arrow B, periodic polarization inversion structures are formed in the ferroelectric crystal substrate 1. That is, polarization inversion parts are formed under the electrodes piece parts 3, respectively, and non-polarization inversion parts are formed under the spaces 4. As a result, as shown in FIG. 2, the polarization inversion parts 5 are formed corresponding to the respective electrode piece parts. Each of the polarization inversion structures includes many polarization inversion parts 6 and non-polarization inversion parts 7 between them. Spaces 18 are formed between the adjacent polarization inversion structures 5, respectively. It is necessary to decrease the period L of the periodic polarization inversion structures to increase the density of the polarization inversion structures.

The inventors then tried to reduce the period S of the electrode piece part-arrays 2, as shown in FIGS. 3(a) and 3(b). However, in this case, when the voltage is applied, a breakdown occurs between the adjacent electrode piece part-arrays and floating electrode 30, so that current leakage occurs as shown by arrow C. In this case, for example as shown in FIG. 11, it is proved that the application of voltage cannot be made from the electrode piece parts so that the periodic polarization inversion structures are not generated.

An object of the present invention is to provide electrode piece part-arrays, each composed of a plurality of electrode piece parts, on a first main face of a ferroelectric crystal substrate and to apply a voltage onto the electrode piece part-arrays to form periodic polarization inversion structures, in which the period of the adjacent periodic polarization inversion structures is reduced and, at the same time, breakdown can be prevented between the electrode piece part-arrays to improve the productivity of the periodic polarization inversion structures.

Solution for the Objects

The present invention provides a method of producing a periodic polarization inversion structure in a ferroelectric crystal substrate having a first main face and a second main face, the method comprising the steps of:

providing first electrode piece part-arrays, each comprising a plurality of electrode piece parts, on the first main face of the ferroelectric crystal substrate;

forming first periodic polarization inversion structures by applying a voltage on said first electrode piece part-arrays;

providing second electrode piece part-arrays comprising a plurality of electrode piece parts, between first periodic polarization inversion structures which are adjacent to each other; and forming second periodic polarization inversion structures by applying a voltage on the second electrode piece part-arrays.

Effects of the Invention

According to the present invention, periodic polarization inversion structures to be formed are divided into at least first and second groups, and the periodic polarization structures of the first group and the periodic polarization inversion structures of the second group are separately formed by the voltage application method. It is thereby possible to maintain a large period of adjacent arrays of the electrode piece parts at the voltage application and, at the same time, to further reduce the period of the periodic polarization inversion structures. As a result, the period of the adjacent periodic polarization inversion structures can be made small and, at the same time, breakdown between the electrode piece part-arrays can be prevented. The productivity of the periodic polarization inversion parts can be thus improved.

MODES FOR CARRYING OUT THE INVENTION

The embodiments of the present invention will be described further in detail, appropriately referring to the attached drawings.

Figure 4A:
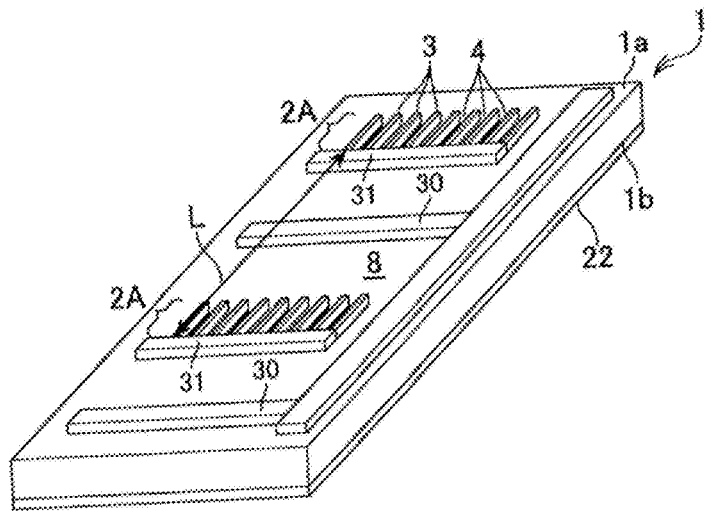
FIG. 4(a) shows the state that first arrays 2A of the electrode piece parts on a first main face 1a of the ferroelectric crystal substrate 1.

First, as shown in FIG. 4(a), a ferroelectric crystal substrate 1 is prepared having a first main face 1a and second main face 1b. However, in the drawings, due to the limit of paper width, only a part A of the ferroelectric crystal substrate 1 is enlarged and shown. Many arrays of the electrode piece parts are formed on the actual ferroelectric crystal substrate 1.

First electrode piece part-arrays 2A of a plurality of the electrode piece parts 3 are provided on the first main face 1a of the ferroelectric crystal substrate 1. Spaces 4 are provided between the adjacent electrode piece parts 3, respectively, and spaces 8 and floating electrodes 30 are provided between the adjacent electrode piece part-arrays 2A, respectively. Further, the respective arrays of the electrode piece parts are connected through a supply electrode 31. The period of the adjacent arrays of the electrode-piece parts is made L.

Figure 4B:
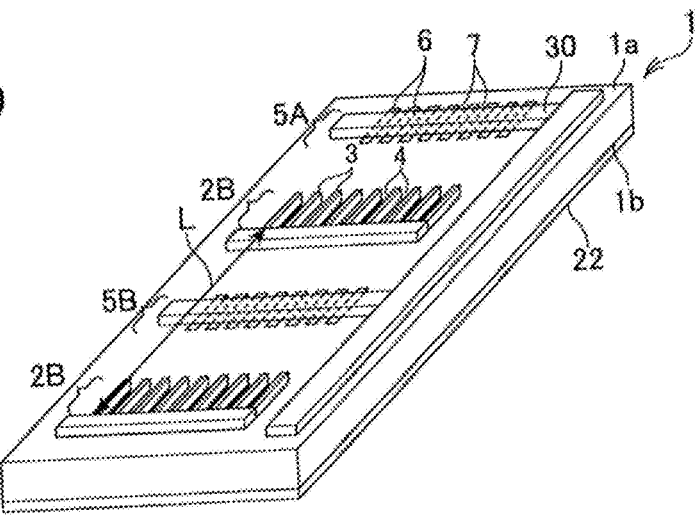
FIG. 4(b) shows the state that second arrays 2B of the electrode piece parts on the first main face 1a, and FIG. 4(c) shows the state that the first periodic polarization inversion structures 5A and second polarization inversion structures 5B are provided in the ferroelectric crystal substrate 1.
Figure 5A:
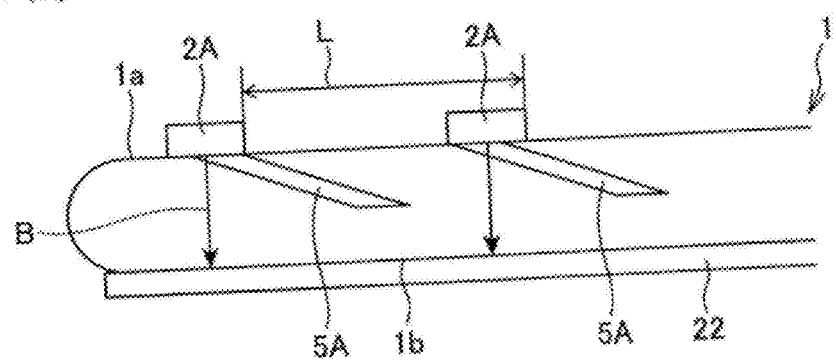
FIG. 5(a) shows the state that the first periodic polarization inversion structures 5A are elongated from the first arrays 2A of the electrode piece parts.

A voltage is then applied on the first arrays of the electrode piece parts to form first periodic polarization inversion structures 5A, as shown in FIGS. 4(b) and 5(a). Here, polarization inversion parts 6 are formed under the respective electrode piece parts 3, non-polarization inversion parts 7 are formed under the respective spaces 4, and the polarization inversion parts 6 and non-polarization inversion parts 7 each constitute a periodic polarization inversion structure 5A. The period of the adjacent periodic polarization inversion structures 5A is L on the first main face 1a.

Figure 4C:
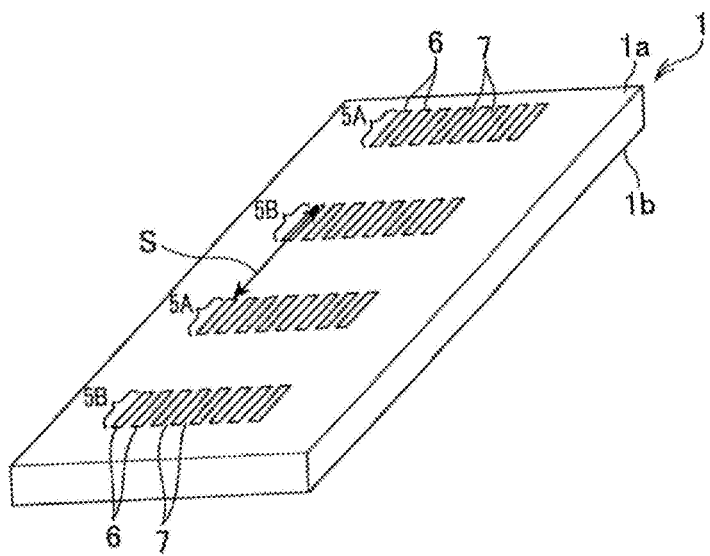
Figure 5B:
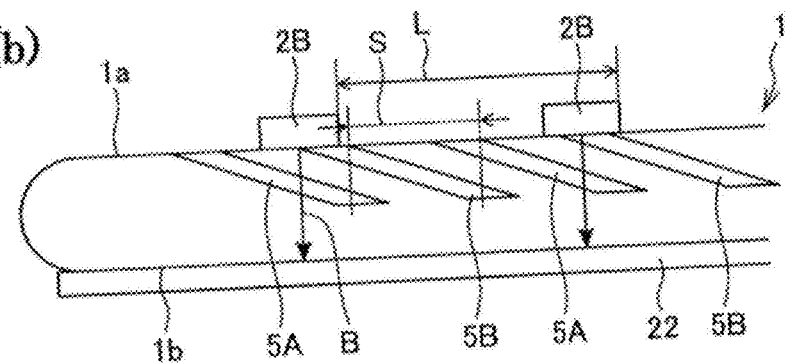
FIG. 5(b) shows the state that the second periodic polarization inversion parts 5B are elongated from the second arrays 2A of the electrode piece parts.

Then, as shown in FIG. 4(b), second electrode piece part-arrays 2B composed of a plurality of the electrode piece parts 3 are formed between adjacent first periodic polarization inversion structures 5A, respectively. Here, the floating electrode 30 is positioned between the opposing electrode piece part-array and supply electrode 31. Typically, the floating electrode 30 is formed over the periodic polarization inversion parts 5A. The voltage is then applied on the second electrode piece part-arrays 2B to form the second periodic polarization inversion structures 2B, as shown in FIGS. 4(c) and 5(b). Here, the polarization inversion parts 6 are formed under the respective electrode piece parts 3, the non-polarization inversion parts 7 are formed under the respective spaces 4, and the polarization inversion parts 6 and non-polarization inversion parts 7 constitute the periodic polarization inversion structures 5B.

As a result, L is assigned to the period of the adjacent first periodic polarization inversion structures 5A on the first main face 1a, and L is also assigned to the period of the adjacent second polarization inversion structures 5B (FIG. 5(a)). However, the period S of the adjacent first periodic polarization inversion structures 5A and second periodic polarization inversion structures 5B can be made considerably smaller than L (FIG. 5(b)). Further, as the voltage is applied on the respective electrode piece part-arrays as shown in FIGS. 4(a) and 4(b), the distance of the adjacent electrode piece arrays becomes as large as L. It is thereby possible to prevent the defects in polarization inversion due to breakdown between the electrode piece part-arrays and to form the periodic polarization inversion structures.

However, it is further found that the following problems are generated according to the embodiments described above.

Figure 6A:
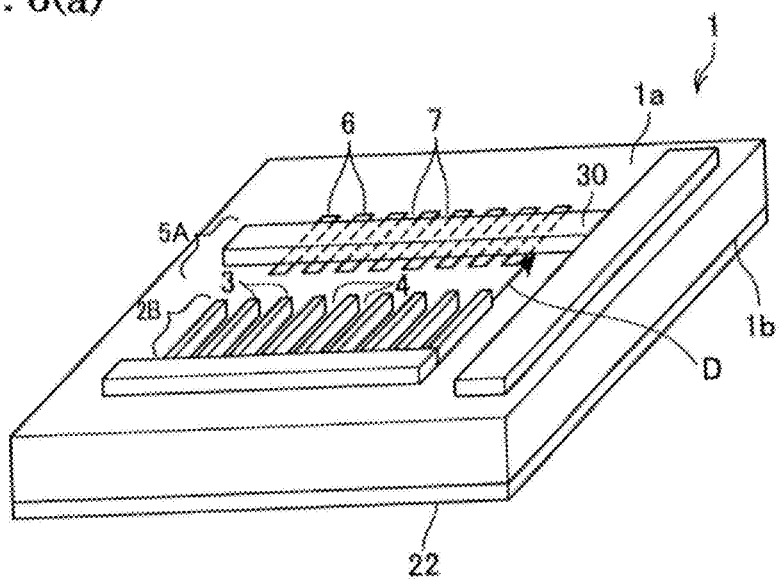
FIG. 6(a) shows the breakdown D extending from the second arrays 2B of the electrode piece parts to the first periodic polarization inversion structures 5A.
Figure 6B:
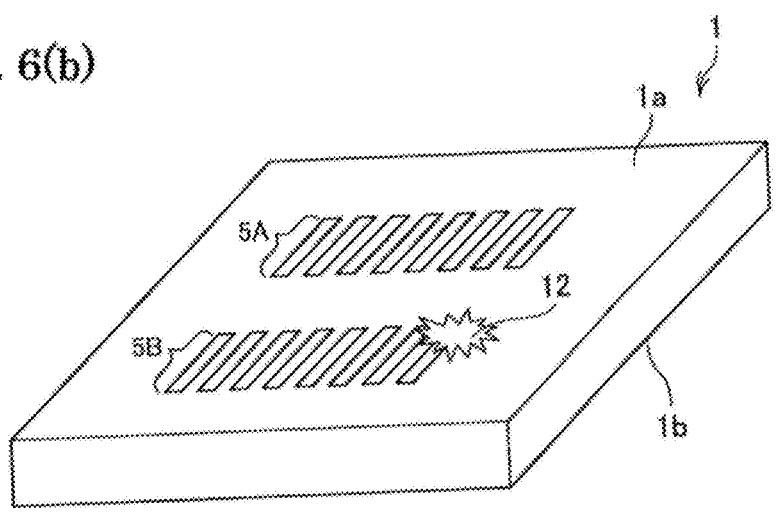
FIG. 6(b) shows damage positions 12.

That is, as shown in FIG. 6(a), after the first periodic polarization inversion parts 5A are formed, the second electrode piece part-arrays 2B are then formed, and the voltage is applied onto the second electrode piece part-arrays 2B. In such a case, as shown in FIG. 6(b), short circuiting may occur as shown by arrow D, resulting in local damages 12 in the second periodic polarization inversion structures 5B.

The inventors further studied the cause of the damages 12 and obtained the following findings. That is, it was proved that the damages 12 are concentrated on the ends of the second periodic polarization inversion structures. It is considered that the breakdown occurs between the ends of the second electrode piece part-arrays and the ends of the first periodic polarization inversion structures formed under the second electrode-piece part-arrays.

Based on the speculation, the inventors tried to set the ends of the first periodic polarization inversion structures apart from the ends of the second electrode piece part-arrays, in the lengthwise direction of the second electrode piece part-arrays. It is thus found that the damages described above can be prevented. This embodiment will be described below.

Figure 7:
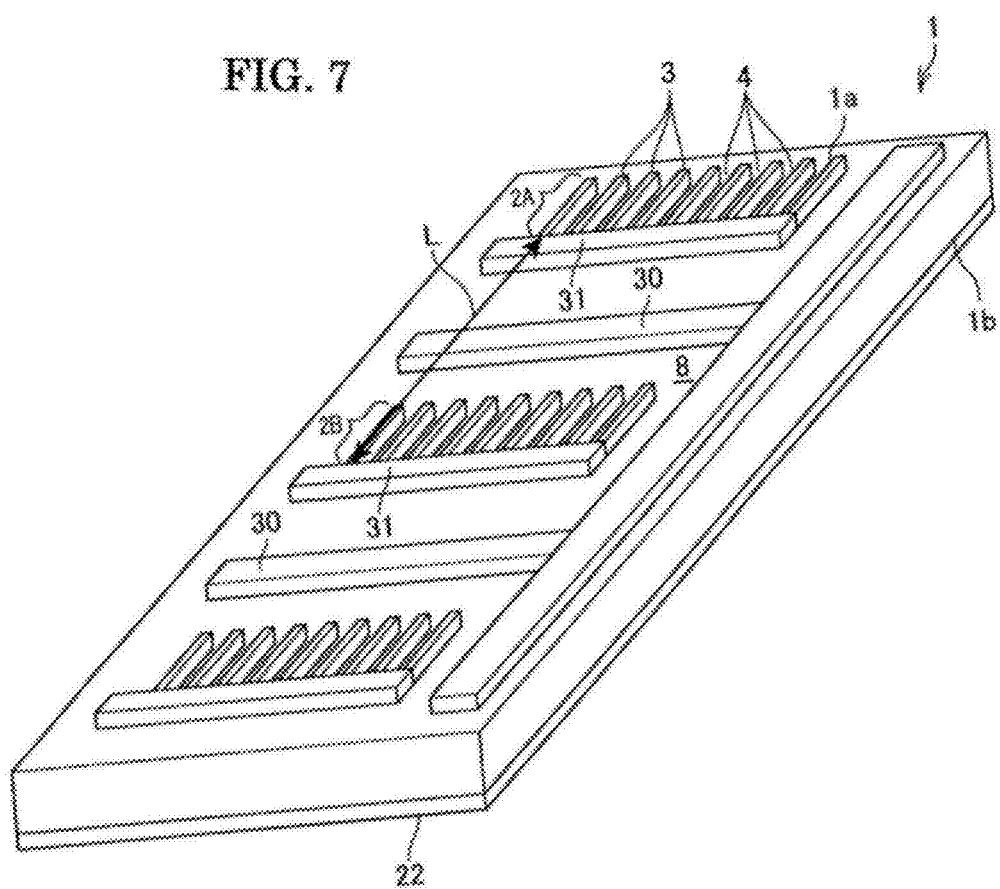
FIG. 7 shows the state that the first electrode piece part-arrays 2A are provided on the first main face 1a of the ferroelectric substrate 1.

That is, as shown in FIG. 7, first electrode piece part-arrays 2A, each being composed of a plurality of electrode piece parts 3, are formed on a first main face 1a of a ferroelectric crystal substrate 1. Spaces 4 are provided between the adjacent electrode piece parts 3, respectively, and spaces 8 are further provided between the adjacent electrode piece part-arrays 2A, respectively. L is assigned to a period of the adjacent electrode piece part-arrays.

Figure 8:
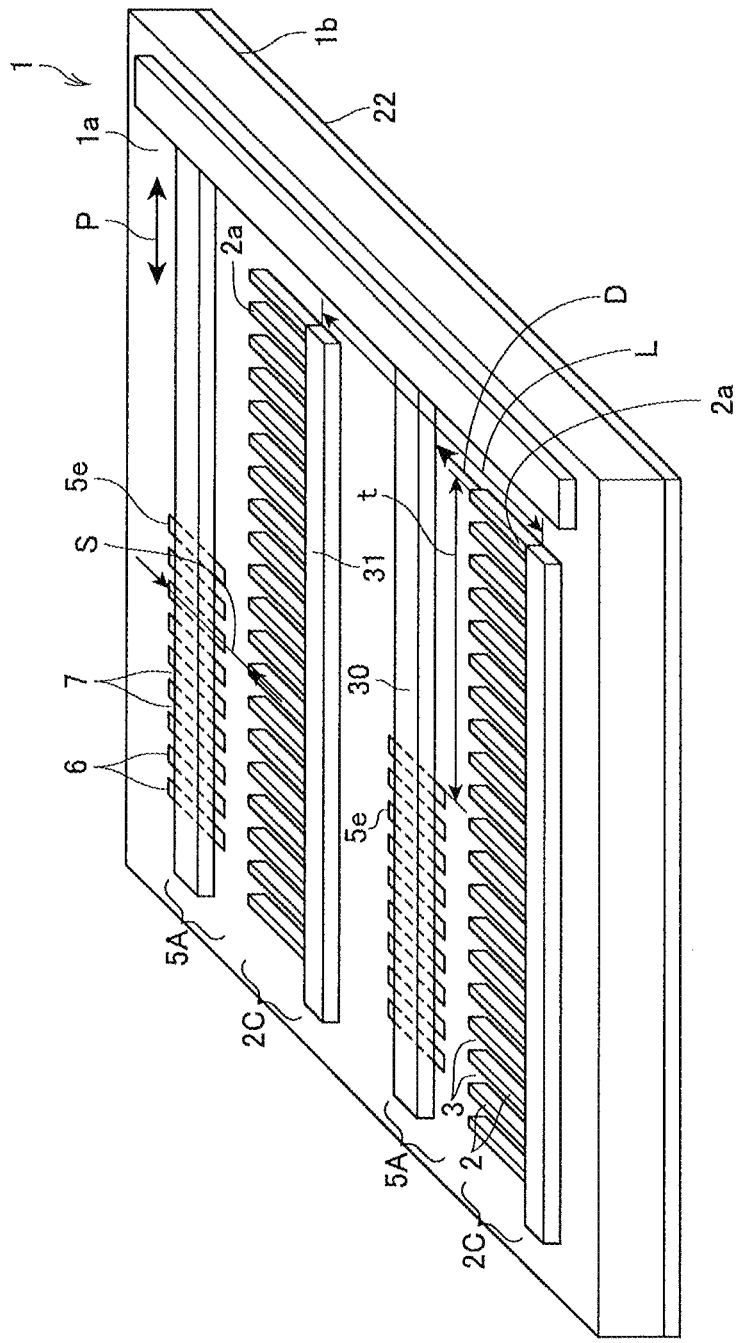
FIG. 8 shows that second arrays 2C of the electrode piece parts are provided on the first main face 1a, in which the ends of the arrays 2C of the electrode piece parts and the ends of the first periodic polarization inversion structures 5A are spaced part.

The voltage is then applied on the first electrode piece part-arrays, to form the first periodic polarization inversion structures 5A as shown in FIG. 8. L is assigned to the period of the adjacent periodic polarization inversion structures 5A on the first main face 1a.

Figure 9:
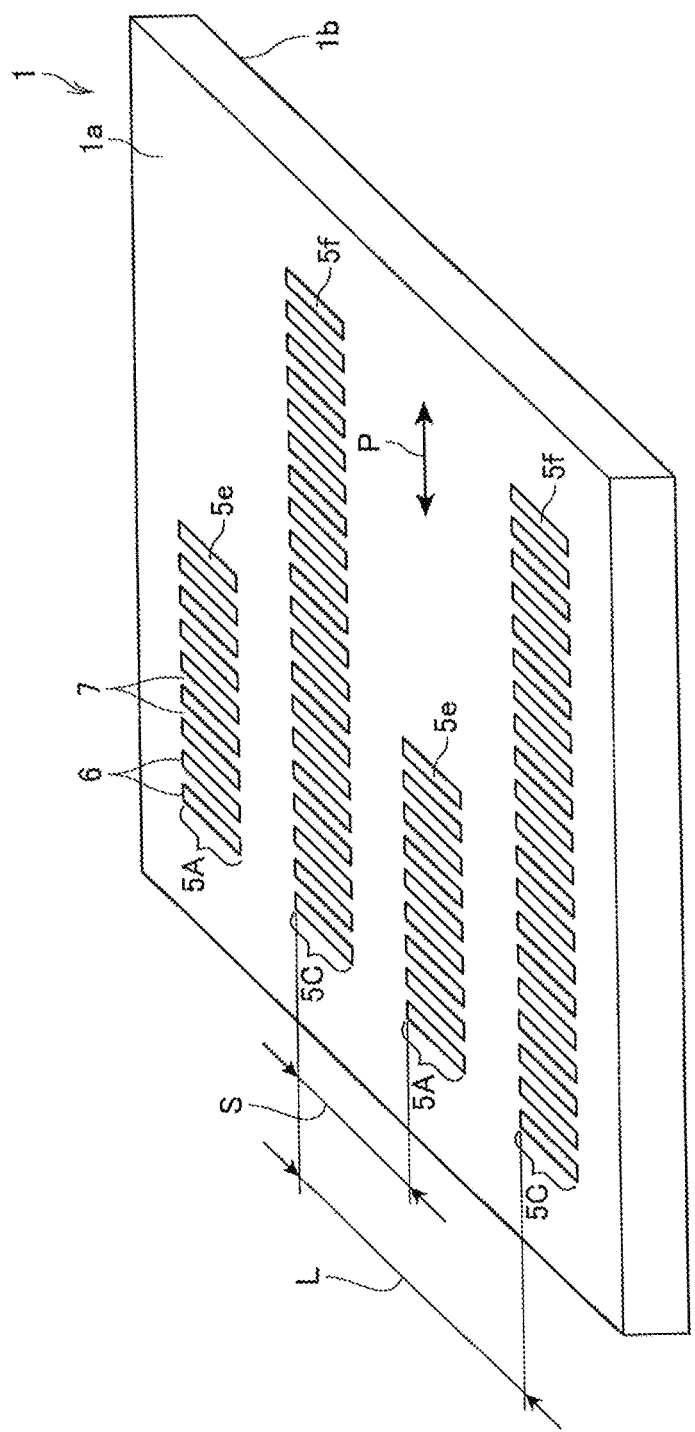
FIG. 9 shows the state that the first periodic polarization inversion structures 5A and second polarization inversion structures 5C are provided in the ferroelectric crystal substrate.

A plurality of the second electrode piece part-arrays 2C, each being composed of a plurality of the electrode piece parts 3, are then formed between the adjacent plural first periodic polarization inversion parts 5A. Here, the ends 5e of the first periodic polarization inversion structures 5A are set apart from the ends 2a of the second electrode piece part-arrays 2C, in the lengthwise direction P of the second electrode piece part-arrays 2C. At this state, the voltage is applied on the second electrode piece part-arrays 2C to form the second periodic polarization inversion structures 5C, as shown in FIG. 9.

As a result, L is assigned to the period of the adjacent first periodic polarization inversion structures 5A and the period of the adjacent second periodic polarization inversion structures 5C is also L on the main face 1a. However, the period S of the adjacent first periodic polarization inversion structures 5A and second polarization inversion structures 5C can be made considerably smaller than L. Moreover, the ends 5e of the first periodic polarization inversion structures are set apart from the ends 5f of the second periodic polarization inversion structures 5C, in the lengthwise direction P of the second periodic polarization inversion structures 5C. As a result, it is possible to prevent damages 12 of the periodic polarization inversion structures due to the breakdown from the ends of the second electrode piece part-arrays toward the ends of the first periodic polarization inversion structures.

Further, in the case that the supply electrode is connected to these second electrode piece part-arrays 2C from the ends on the left side not shown in FIG. 8, a local concentration of the electric field does not occur at the end on the left side, so that damages are prevented. Then, it is not necessary to set the ends on the left side of the first electrode piece part-array 2A apart from the ends on the left side of the second electrode piece part-array 2C in the lengthwise direction.

Figure 10:
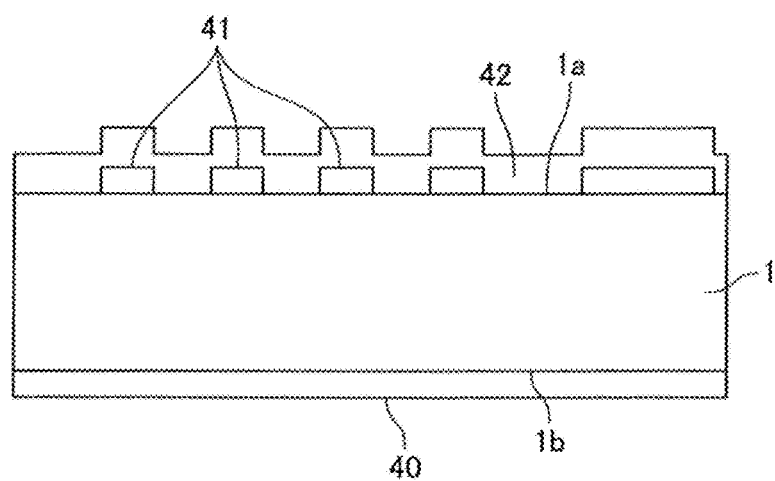
FIG. 10 shows the state that patterned conductive films and an insulting film are provided on the first main face 1a of the ferroelectric crystal substrate and that an opposing electrode is provided on the second main face 1b.

The shape of the electrode piece part is not particularly limited and may be a conventional comb-like electrode. According to a preferred embodiment, insulating electrodes are formed between the electrode piece parts, respectively, on the first main face of the ferroelectric crystal substrate, and a uniform electrode is formed on the second main face of the ferroelectric crystal substrate, and a voltage is applied between the electrode piece parts and uniform electrode. FIG. 10 relates to this embodiment.

First, a uniform conductive film is formed on the first main face 1a of the ferroelectric crystal substrate 1 and the conductive film is then patterned to form many lines of elongate conductive films 41, as shown in FIG. 10. An insulating film 42 is provided to cover the conductive films 41.

As a result, the array of the electrode piece parts composed of many lines of elongate conductive films 41 are arranged so that the insulating film 42 is intervened between the adjacent electrode piece parts. The voltage is applied on the respective electrode piece parts from the common supply electrode 31.

A conductive film 40 is formed over the whole of the second main face 1b of the substrate 1.

The ferroelectric crystal of the substrate in which the periodic polarization inversion structures formed therein is not particularly limited. However, it includes lithium niobate ($LiNbO_3$), lithium tantalate ($LiTaO_3$), lithium niobate-lithium tantalate solid solution, $K_3Li_2Nb_5O_{15}$ and $La_3Ga_5SiO_{14}$. The ferroelectric crystal may preferably be a single crystal.

As the ferroelectric crystal substrate, it is preferred an X-cut substrate, off-cut X-cut substrate, Y-cut substrate or off-cut Y-cut substrate. The off-cut angle may preferably be 10° or lower and more preferably be 5° or lower.

Although the material of the insulating film is not limited, the material may be an oxide such as silicon oxide ($SiO_2$), tantalum pentoxide ($Ta_2O_5$), aluminum oxide ($Al_2O_3$), or a nitride such as silicon nitride. Silicon oxide which is easy to be removed by etching by an agent after the polarization inversion is more preferred.

Although the thickness of the patterned insulating film is not particularly limited, it may preferably be 500 angstroms or larger and 4000 angstroms or smaller. In the case that the thickness of the insulating film is small, the insulating property becomes lower so that it is difficult to form the polarization inversion. In the case that the insulating film is too large, the precision of patterning is deteriorated.

Although the material of the electrode piece part or counter electrode is not particularly limited, the material may preferably be Al, Au, Ag, Cr, Cu, Ni, Ni—Cr, Pd, Ta, Mo, W, Ta, a laminated film of AuCr and the like.

Although the method of forming the electrode piece part or counter electrode is not particularly limited, the method may be vapor deposition or a sputtering method. The thickness of the electrode may be made 500 to 3000 angstroms, for example.

A voltage is then applied between the electrode piece parts and the counter electrodes to form the periodic polarization inversion structures in the substrate.

The temperature of the ferroelectric crystal substrate during the application of the voltage may preferably be 15° C. or higher and more preferably be 25° C. or higher, from the viewpoint of facilitating the formation of the periodic polarization inversion structures. Further, the temperature of the ferroelectric crystal substrate during the application of the voltage may preferably be 60° C. or lower and more preferably be 40° C. or lower, from the viewpoint of preventing cracks or pyroelectricity of the ferroelectric crystal substrate.

The ferroelectric crystal substrate may be provided in an atmosphere and may preferably be provided in an insulating liquid. Such an insulating liquid includes an insulating oil (for example, silicone oil) and a fluoride-based inert liquid.

The method of applying the voltage is not particularly limited. For example, the voltage may be applied while the substrate is provided in an inert atmosphere or while the substrate is provided in the insulating liquid. In the case that the voltage is applied using a probe pin for applying the voltage, the pin may preferably be contacted at the central position.

The voltage may preferably be a pulsed voltage and a direct current bias voltage may be further applied. Preferred conditions of the pulsed voltage are as follows.

Pulsed voltage: 2.0 kV~8.0 kV (/mm)
Pulse width: 0.1 ms~10 ms
Direct current bias voltage: 1.0 kV~5.0 kV (/mm)

According to the present invention, after the second electrode piece arrays are formed to form the second periodic polarization inversion structures, separate electrode piece part-arrays may be formed between the first periodic polarization inversion structures and the second polarization inversion structures and the voltage may be applied on the third electrode piece part-arrays to form third periodic polarization inversion structures. In this case, although the number of applications of the voltage is increased, instead the density of the periodic polarization inversion structures can be further increased instead. Further, the formation of the electrode piece part-arrays and application of the voltage may be repeated four times or more.

The period L of the adjacent electrode piece part-arrays during the voltage application may be selected depending on the material and may preferably be 1.4 mm or lower and more preferably be 1.2 mm or lower, for example. Further, if the period L of the adjacent electrode piece part-arrays during the voltage application is too small, the influences of short circuiting may occur. The period may preferably be 0.4 mm or larger, more preferably be 0.6 mm or larger and most preferably be 0.7 mm or larger.

According to a preferred embodiment, the ends of the adjacent first periodic polarization inversion structures are set apart from the ends of the electrode piece part-arrays, in the lengthwise direction of the second electrode piece part-arrays. In this case, a distance t (refer to FIG. 8) of the end of the first periodic polarization inversion structure and end of the second electrode piece part-array, in the lengthwise direction may preferably be 1 mm or larger and more preferably be 3 mm or larger. However, as the effects are not further improved in the case that the distance is made too large, the distance t may preferably be made 5 mm or smaller.

The inventive device may be applied to a higher-order harmonic wave generating device such as a second harmonic wave generating device. In the case that it is used as the second harmonic wave generating device, the wavelength of the higher-order harmonic wave may preferably be 330 to 1700 nm.

EXAMPLES

Comparative Example 1

Figure 1A:
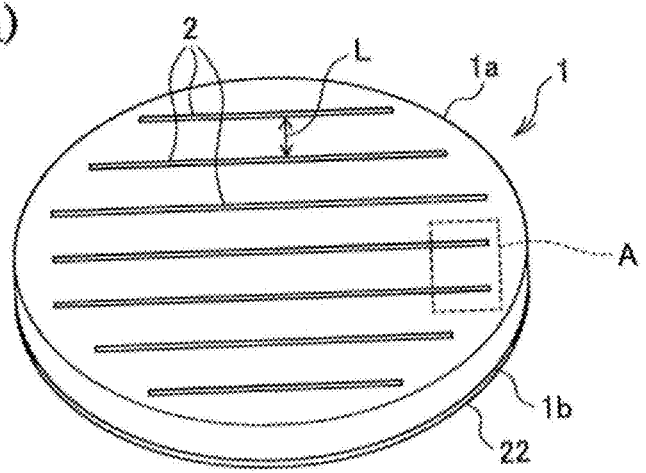
FIG. 1(a) schematically shows a plurality of lines of electrode piece part-arrays 2 on a ferroelectric crystal substrate 1.
Figure 1B:
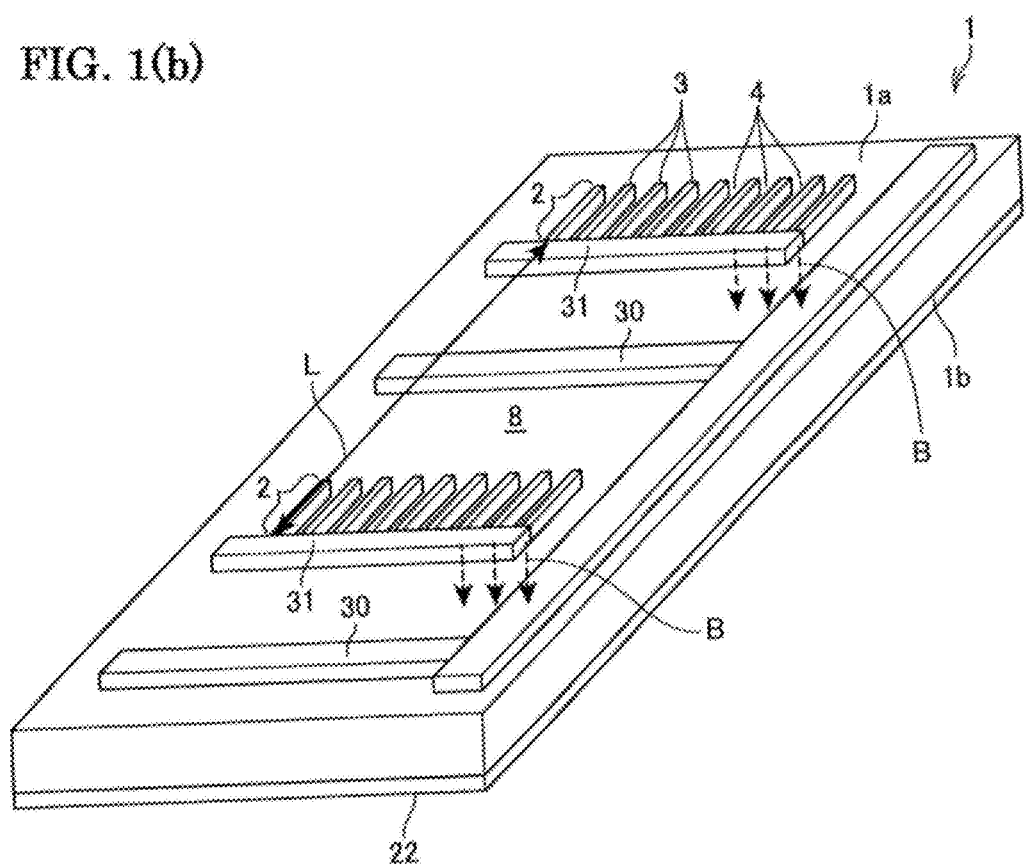
FIG. 1(b) is an enlarged view of a region A shown in FIG. 1(a).
Figure 2:
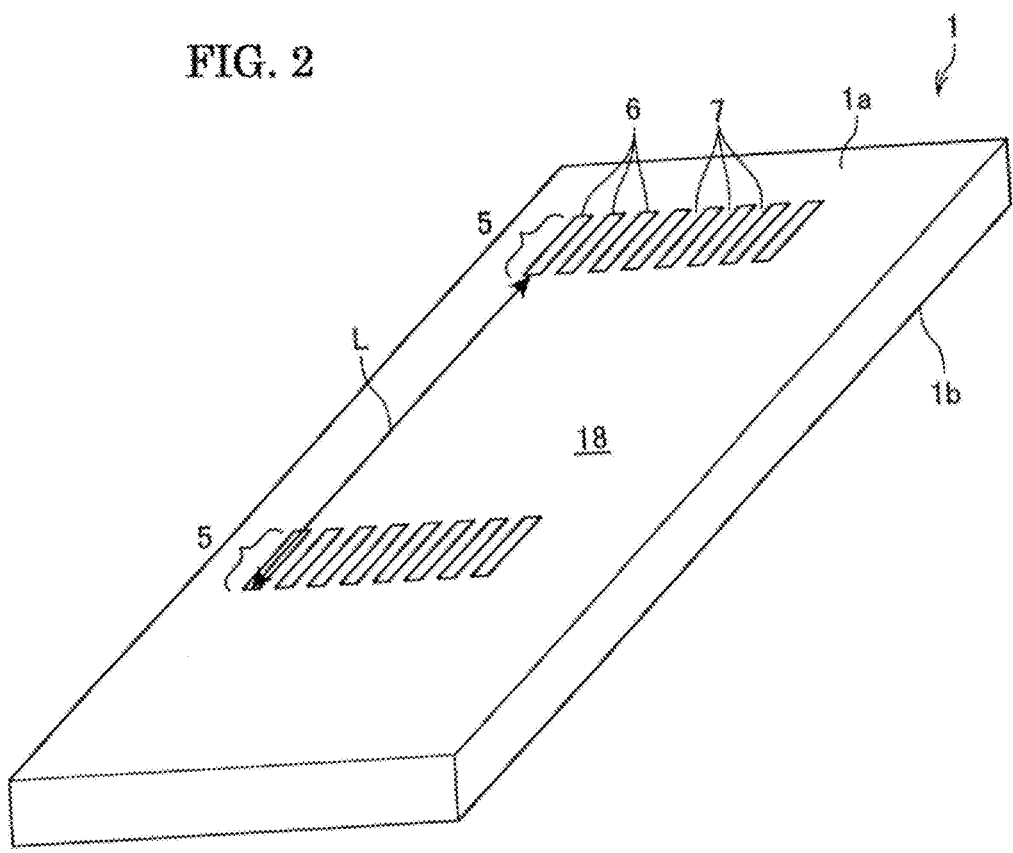
FIG. 2 shows the state that periodic domain inversion structures 5 are formed in the substrate 1.
Figure 3A:
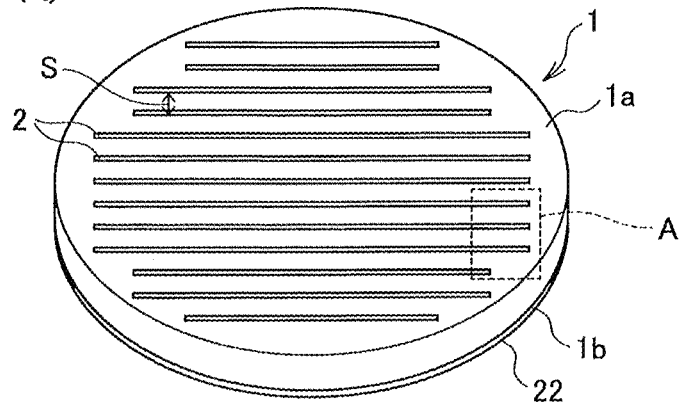
FIG. 3(a) schematically shows the state that a plurality of lines of the electrode piece part-arrays 2 on the ferroelectric crystal substrate 1.
Figure 3B:
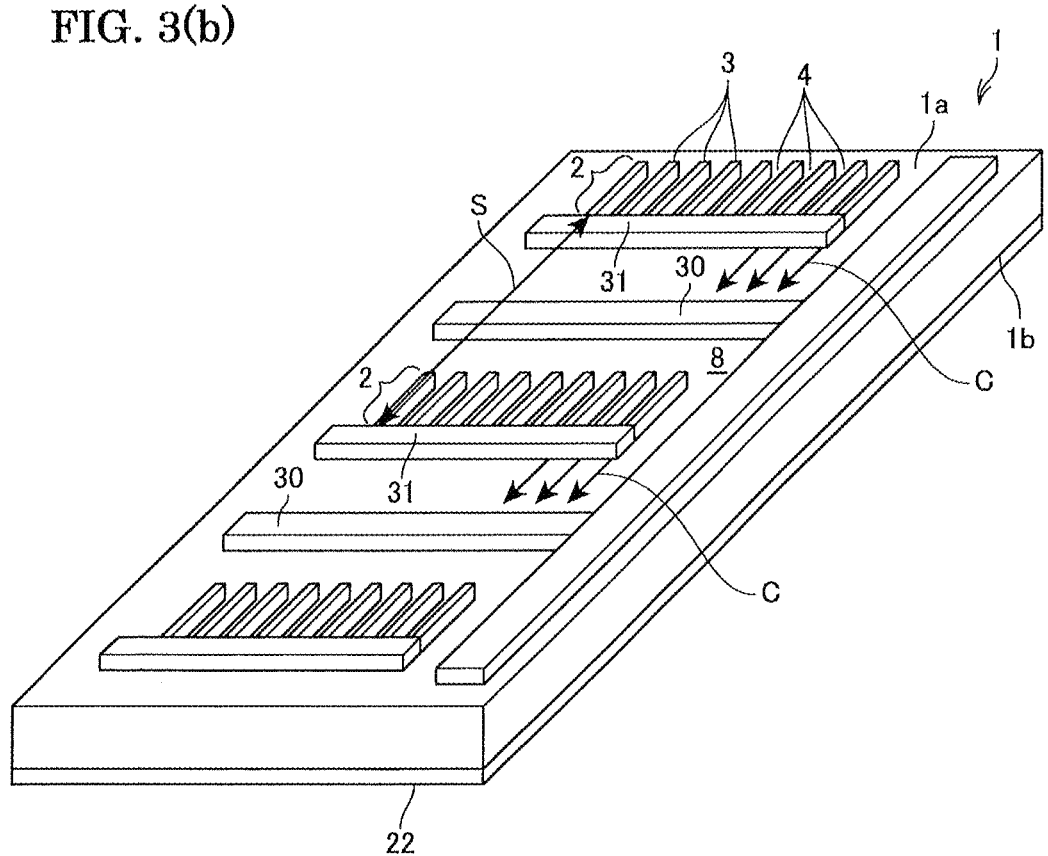
FIG. 3(b) is an enlarged view of a region A shown in FIG. 3(a).

As shown in FIGS. 3 and 10, periodic polarization inversion structures 5 were formed in a ferroelectric crystal substrate 1.

Specifically, as the substrate 1, an off-cut Y-cut substrate of $LiNbO_3$ doped with MgO was used. The off-cut angle was 5°. Molybdenum film was formed as a conductive film on a first main face 1a of the substrate 1. Further, a molybdenum film was formed as a conductive film 40 on a second main face 1b of the substrate 1 according to the similar procedure. The thickness of each of the conductive films was about 1000 angstroms.

A photoresist was then spin-coated on the conductive film on the main face 1a and subjected to exposure using a mask and developing to form a resist pattern having a period of about 6.5 μm. The resist pattern was used as a mask to perform wet-etching treatment to form patterned conductive films 41, as shown in FIG. 10.

An insulating film 42 was then formed by sputtering. Its film thickness was made 2000 angstroms and the material was silicon oxide. However, as shown in FIG. 3, the period S of the adjacent electrode piece part-arrays 2 on the main face 1a was made 0.4 mm.

The thus produced substrate 1 was immersed in an insulating oil and a pulsed voltage was applied thereon at 25° C. As to the conditions of applying the voltage, the voltage was set at about 2.8 kV/mm and a rectangular pulse of a width of 1 msec was applied.

Figure 11:
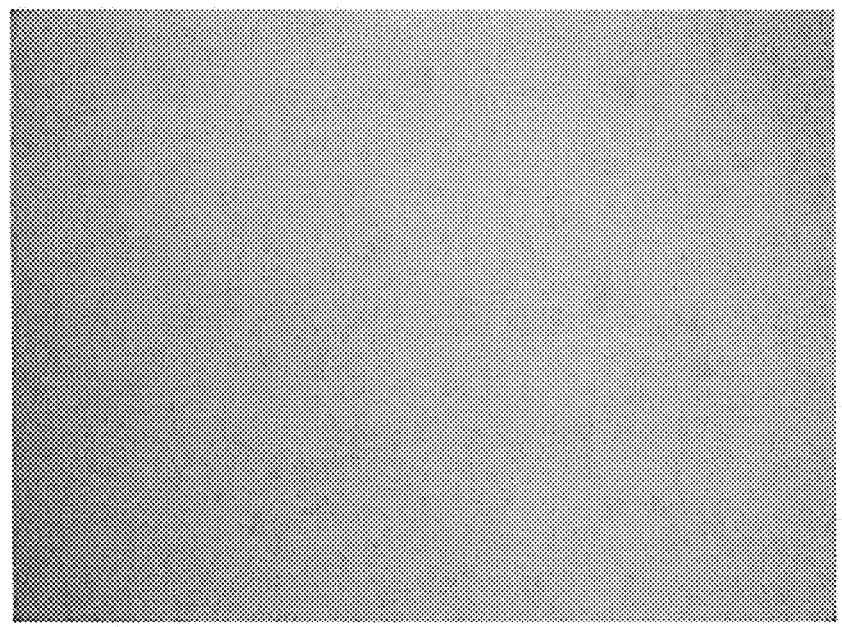
FIG. 11 is a photograph showing the state that the periodic polarization inversion structure is not formed in Comparative Example 1.

After the application of the voltage, wet etching was performed using 50% fluoric acid for confirming whether the polarization inversion took place. As a result, as shown in FIG. 11, it was proved that the periodic polarization inversion structures were not formed. This is because the period S of the electrode piece part-arrays 2 is too small and results in short circuiting between the electrodes, even at a small voltage, to prevent the formation of the polarization inversion parts.

Comparative Example 2

The periodic polarization inversion structures were formed in the ferroelectric crystal substrate according to the procedure similar to that in Comparative Example 1. However, the period S of the adjacent electrode piece part-arrays 2 was made as large as 0.6 mm to lower the density of the electrode piece part-arrays 2 to some extent.

Figure 12:
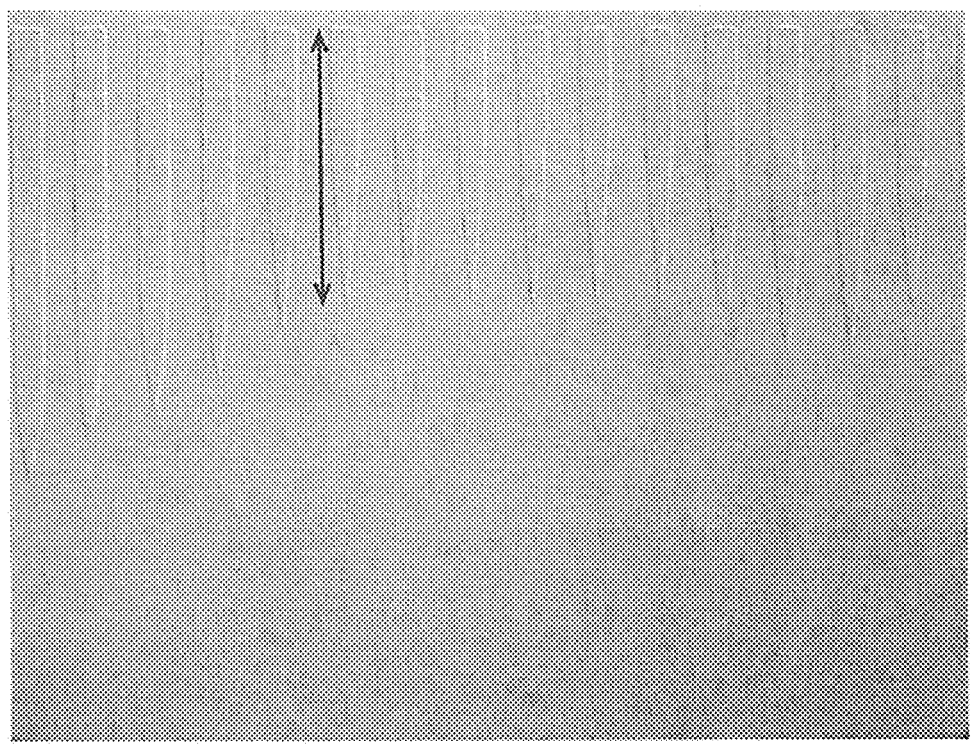
FIG. 12 is a photograph showing the state that the length of the periodic polarization inversion structure is made smaller in Comparative Example 2.

As a result, as shown in FIG. 12, the periodic polarization inversion structures were formed, but the length of each periodic polarization inversion structure was as short as about 30 µm (note that an arrow has a length of 30 µm). This is because a high voltage cannot be applied for preventing short circuiting between the adjacent electrode piece part-arrays.

Inventive Example 1

The periodic polarization inversion structures were formed according to the similar procedure as Comparative Example 1. However, according to the present example, as shown in FIGS. 4 and 5, the first electrode piece part-arrays 2A and second electrode piece arrays 2B were provided separately to separately form the first periodic polarization inversion structures 5A and second periodic polarization inversion structures 5B. The period L of the first electrode piece part-arrays 2A was made 0.8 mm, and the period S of the first periodic polarization inversion structures and second electrode piece part-arrays was made 0.4 mm. The other procedural steps were same as those in the comparative example 1.

Figure 13:
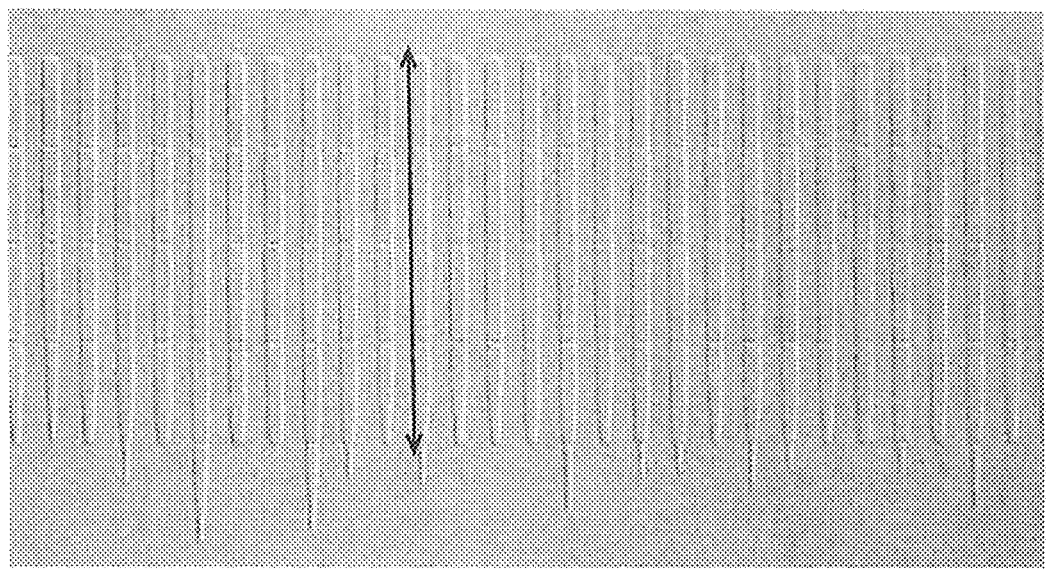
FIG. 13 is a photograph showing the state that preferred periodic polarization inversion structures are formed, in Inventive Example 1.
Figure 14:
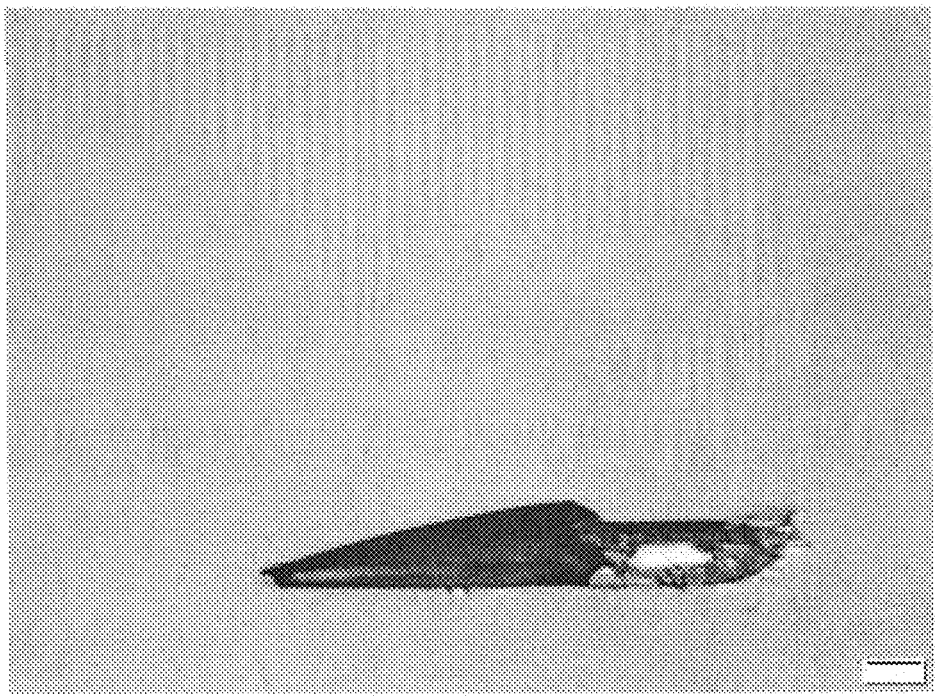
FIG. 14 is a photograph showing the state that local damages are generated due to the concentration of the electric field at the ends of the periodic polarization inversion structures, in Inventive Example 1.

As a result, as shown FIG. 13, good periodic polarization inversion structures were successfully formed, each having a length of about 60 µm at a small interval (note that an arrow has a length of about 60 µm). However, as shown in FIG. 14, damages 12 were occasionally observed (refer to FIG. 6(b)) due to the concentration of the electric field between the ends of a part of the electrode piece part-arrays and the ends of the first periodic polarization inversion structures when the voltage is applied onto the second electrode piece part-arrays.

Inventive Example 2

The periodic polarization inversion structures were formed as the similar procedure as Inventive Example 1. However, according to the present example, the period L of the first electrode piece part-arrays was made 1.2 mm, and the period S of the first periodic polarization inversion structures and second electrode piece part-arrays was made 0.6 mm. The density of the periodic polarization inversion structures was lowered to some extent.

Figure 15:
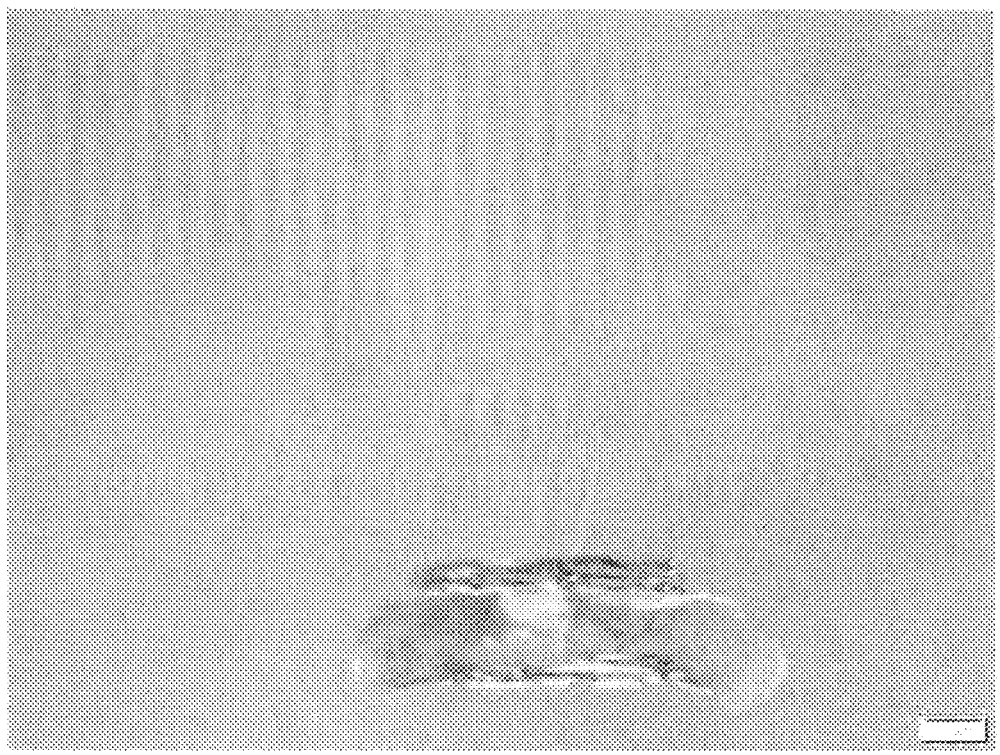
FIG. 15 is a photograph showing the state that local damages are generated due to the concentration of the electric field at the ends of the periodic polarization inversion structures, in Inventive Example 2.

As a result, good first periodic polarization inversion structures and second polarization inversion structures were successfully formed, each having a length of about 50 µm. Further, they could be successfully formed at a narrow interval. However, as shown in FIG. 15, damages 12 were occasionally observed (refer to FIG. 6(b)) due to the concentration of the electric field between the ends of a part of the electrode piece part-arrays and the ends of the first periodic polarization inversion structures when the voltage was applied onto the second electrode piece part-arrays. However, it was proved that the degree of the damages was lower than that of the damages in Inventive Example 1 (refer to FIG. 14).

Inventive Example 3

The electrode piece arrays were formed as those in Inventive Example 1 and it was tried to form the periodic polarization inversion structures. However, according to the present example, as shown in FIG. 8, the ends 5e of the first periodic polarization inversion structures 5A were set apart from the electrode piece part-arrays 2C, by a distance of 2 mm (t) in the lengthwise direction P of the first electrode piece part-arrays 2C.

Figure 16:
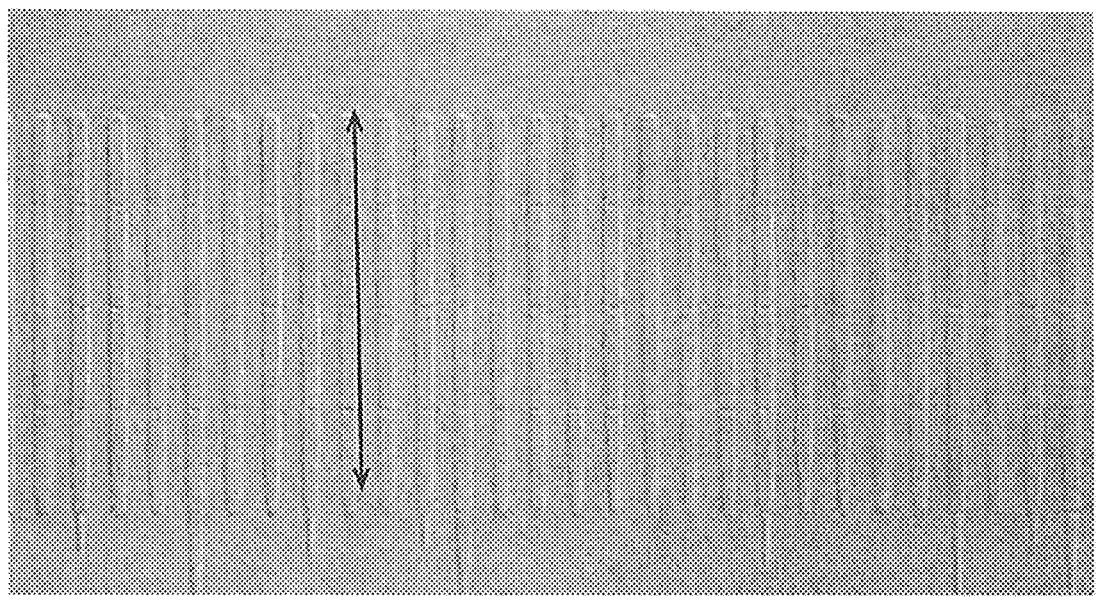
FIG. 16 is a photograph showing the state that preferred periodic polarization inversion structures are formed, in Inventive Example 3.
Figure 17:
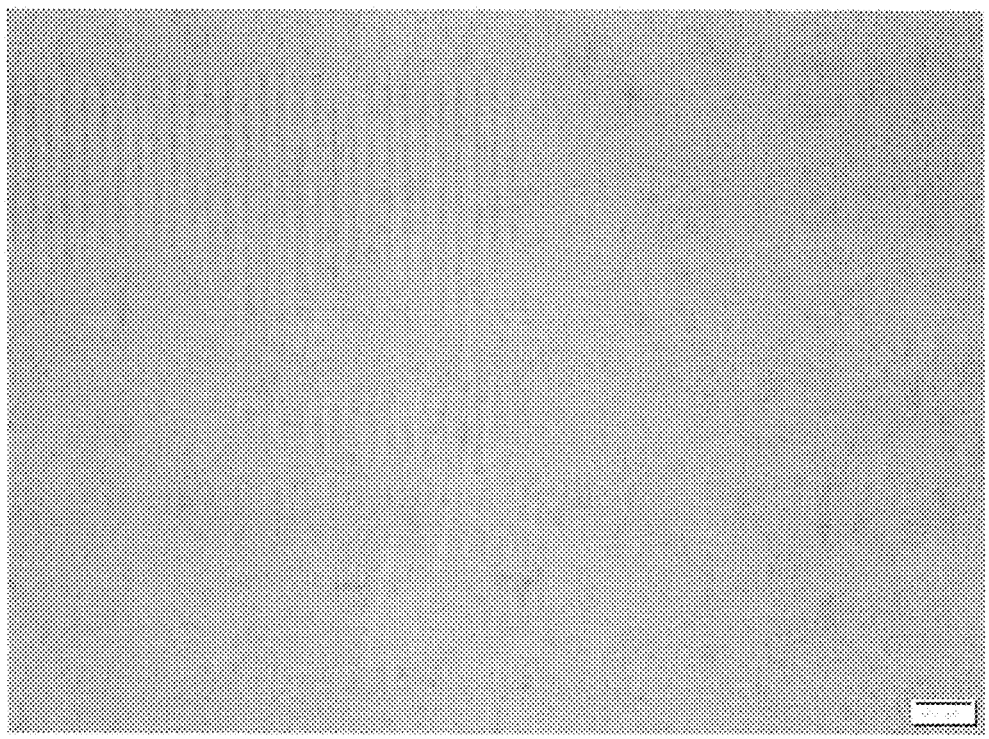
FIG. 17 is a photograph showing the state that local damages due to concentration of electric field are prevented at the ends of the periodic polarization inversion structures, in Inventive Example 3.

As a result, as shown in FIG. 16, good periodic polarization inversion structures were successfully formed, each having a length of about 60 µm at a narrow interval (note that an arrow has a length of 60 µm). Further, as shown in FIG. 17, damages 12 due to the concentration of the electric field between the ends of a part of the electrode piece part-arrays and the ends of the first polarization inversion structures were not observed when the voltage was applied on the second electrode piece part-arrays.

The invention claimed is:

1. A method of producing periodic polarization inversion structures in a ferroelectric crystal substrate having a first main face, a second main face, a first side face and a second side face opposing said first side face in a lengthwise direction, the method comprising the steps of:
   providing first electrode piece part-arrays each comprising a plurality of electrode piece parts on said first main face of said ferroelectric crystal substrate;
   forming first periodic polarization inversion structures by applying a voltage on said first electrode piece part-arrays, each of said first periodic polarization structures including a first end nearest to said first side face and a second end nearest to said second side face;
   providing second electrode piece part-arrays each comprising a plurality of electrode piece parts, each of said second electrode piece part-arrays being present between said first periodic polarization inversion structures adjacent to each other and including a first end nearest to said first side face and a second end nearest to said second side face; and
   forming second periodic polarization inversion structures by applying a voltage on said second electrode piece part-arrays,
   wherein said first end of each of said first periodic polarization inversion structures is set apart from said first end of each of said second electrode piece part-arrays by a distance of 1-5 mm in the lengthwise direction.

2. The method of claim 1, further comprising the steps of:
   forming insulating films between said electrode piece parts, respectively, on said first main face of said ferroelectric crystal substrate;
   providing a uniform electrode on said second main face of said ferroelectric crystal substrate; and
   applying said voltage between said electrode piece parts and said uniform electrode.

* * * * *